(12) United States Patent
Kim et al.

(10) Patent No.: US 7,179,709 B2
(45) Date of Patent: Feb. 20, 2007

(54) METHOD OF FABRICATING NON-VOLATILE MEMORY DEVICE HAVING LOCAL SONOS GATE STRUCTURE

(75) Inventors: Sang-Su Kim, Suwon-si (KR); Geum-Jong Bae, Incheon-si (KR); In-Wook Cho, Yongin-si (KR); Jin-Hee Kim, Seongnam-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 11/146,501

(22) Filed: Jun. 7, 2005

(65) Prior Publication Data

US 2006/0035432 A1   Feb. 16, 2006

(30) Foreign Application Priority Data

Aug. 13, 2004   (KR) ................ 10-2004-0064032

(51) Int. Cl.
*H01L 21/336* (2006.01)
*H01L 21/4763* (2006.01)
*H01L 21/3205* (2006.01)

(52) U.S. Cl. ............ 438/257; 438/258; 438/259; 438/260; 438/261; 438/262; 438/263; 438/264; 438/265; 438/266; 438/267; 438/954; 438/585; 438/588; 438/591; 438/592; 438/593; 438/594; 257/E21.18; 257/E21.177

(58) Field of Classification Search ........ 438/257, 438/258–267, 954, 585, 588, 591–594
See application file for complete search history.

(56) References Cited

U.S. PATENT DOCUMENTS 6,204,159 B1    3/2001   Chang et al. ............ 438/594
6,429,073 B1*   8/2002   Furuhata et al. ......... 438/258
6,664,155 B2*  12/2003   Kasuya .................... 438/211
7,029,976 B1*   4/2006   Nagarad et al. ......... 438/258
2002/0197800 A1* 12/2002 Hashimoto et al. ...... 438/266
2005/0224866 A1* 10/2005 Higashi et al. .......... 257/324

FOREIGN PATENT DOCUMENTS

| KR | 2002-0073959 | 9/2002 |
| KR | 2003-0013763 | 2/2003 |

* cited by examiner

*Primary Examiner*—Walter Lindsay, Jr.
*Assistant Examiner*—Mohsen Ahmadi
(74) *Attorney, Agent, or Firm*—Mills & Onello LLP

(57) ABSTRACT in methods of fabricating a non-volatile memory device having a local silicon-oxide-nitride-oxide-silicon (SONOS) gate structure, a semiconductor substrate having a cell transistor area, a high voltage transistor area, and a low voltage transistor area, is prepared. At least one memory storage pattern defining a cell gate insulating area on the semiconductor substrate within the cell transistor area is formed. An oxidation barrier layer is formed on the semiconductor substrate within the cell gate insulating area. A lower gate insulating layer is formed on the semiconductor substrate within the high voltage transistor area. A conformal upper insulating layer is formed on the memory storage pattern, the oxidation barrier layer, and the lower gate insulating layer. A low voltage gate insulating layer having a thickness which is less than a combined thickness of the upper insulating layer and the lower gate insulating layer is formed on the semiconductor substrate within the low voltage transistor area.

28 Claims, 9 Drawing Sheets

METHOD OF FABRICATING NON-VOLATILE MEMORY DEVICE HAVING LOCAL SONOS GATE STRUCTURE

CROSS-REFERENCE TO RELATED APPLICATION

This application claims the benefit of Korean Patent Application No. 2004-0064032, filed Aug. 13, 2004, the contents of which are hereby incorporated herein by reference in their entirety.

BACKGROUND OF THE INVENTION

1. Field of the Invention

The present invention relates to a method of fabricating a non-volatile memory device and, more particularly, to a method of fabricating a non-volatile memory device having a local SONOS gate structure.

2. Description of the Related Art

Semiconductor memory devices can be classified as volatile memory devices and non-volatile memory devices based on the manner in which data is stored. The volatile memory device loses stored data when the power supply is interrupted, whereas the non-volatile memory device retains data even when the power supply is not supplied thereto. Accordingly, non-volatile memory devices, for example, flash memory devices, are widely employed in mobile communication systems, memory cards, etc.

Non-volatile memory devices can be in turn classified as floating gate type and a charge trap type based on kinds of memory storage layers constituting a unit cell. The floating gate type enjoyed widespread popularity. However, in the floating-gate memory device, charge is stored in polycrystalline silicon, so that memory retention characteristics may be affected by even a small defect in a tunneling oxide layer. On the other hand, a silicon-oxide-nitride-oxide-silicon (SONOS) device which is the charge-trap memory device employing a nitride layer as the memory storage layer has been disclosed in recent years. The SONOS device includes a silicon layer having a channel area formed therein, an oxide layer forming a tunneling layer, a nitride layer used as a charge trapping layer, an oxide layer used as a blocking layer, and a polysilicon layer used as a control gate electrode. The nitride layer is a non-conductive layer, so any charge stored therein do not freely move. Thus, the nitride layer is less affected by a defect in the tunneling oxide layer. As a result, the device has excellent memory retention characteristics. In recent years, a local SONOS gate structure has been proposed where the nitride layer used as the charge trapping layer overlaps only a portion of the control gate electrode. It is well known that the non-volatile memory device having the local SONOS gate structure demonstrates enhanced operating characteristics by adjusting the overlapping length of the charge trapping layer and the control gate electrode.

A method of fabricating the SONOS charge trapping memory device is disclosed in U.S. Pat. No. 6,664,155 B2 entitled "Method of manufacturing semiconductor device with memory area and logic circuit area" to Kasuya et al.

According to Kasuya et al, a gate insulating layer and a first conductive layer are sequentially deposited on the entire surface of a semiconductor substrate having a memory area and a logic circuit area. In addition, a stopper layer is formed on the first conductive layer. The stopper layer and the first conductive layer are patterned to form a word gate on the memory area. An oxide-nitride-oxide (ONO) layer and a control gate are then formed on sidewalls of the word gate. The stopper layer and the first conductive layer are patterned again to form a gate electrode in the logic circuit area.

In general, the SONOS device includes a cell area and a peripheral circuit area. In this case, the cell area substantially indicates the memory area, and the peripheral circuit area substantially indicates the logic circuit area. Low voltage transistors, middle voltage transistors, and high voltage transistors are included in the peripheral circuit area, and cell transistors and select transistors are included in the cell area. In addition, a low voltage or a high voltage is applied to the cell transistor in response to a driving state of the device.

According to the aforementioned conventional approach, however, the thickness of the gate insulating layer that is formed in the cell area and the peripheral circuit area is the same. That is, the cell gate insulating layer and the high voltage gate insulating layer are formed to have the same thickness. When the thickness of the cell gate insulating layer and the high voltage gate insulating layer is small, defects due to stress can be caused in the high voltage transistors. On the contrary, when the thickness of the cell gate insulating layer and the high voltage gate insulating layer is large, the on-cell current of the cell transistor is reduced.

In addition, in the cell transistor of the non-volatile memory device having the local SONOS gate structure, a memory storage pattern and a cell gate insulating layer are simultaneously interposed between a channel area and a control gate electrode. That is, the cell transistor includes the channel area, a memory storage pattern and a cell gate insulating layer planarly disposed on the channel area and having at least one sidewall thereof being in contact with each other, and the control gate electrode covering both of the memory storage pattern and the cell gate insulating layer. In this case, when the cell gate insulating layer is too thick, a problem occurs in that the on-cell current of the cell transistor is reduced.

SUMMARY OF THE INVENTION

The present invention is directed to a method of fabricating a non-volatile memory device in which each of the gate insulating layers of the different types of transistors formed on the device is formed at a desired, and different, thickness based on the characteristics of each transistor. Accordingly, a cell gate insulating layer, a high voltage gate insulating layer within the high voltage transistor, a middle voltage gate insulating layer within the middle voltage transistor, and a low voltage gate insulating layer within the low voltage transistor are formed to have thicknesses that are different from each other.

Embodiments of the invention provide a method of forming a cell gate insulating layer, a high voltage gate insulating layer thicker than the cell gate insulating layer, and a low voltage gate insulating layer thinner than the high voltage gate insulating layer within the same semiconductor substrate in a non-volatile memory device having a local SONOS gate structure.

In one aspect, the invention is directed to a method of fabricating a non-volatile memory device having a local SONOS gate structure. The method includes preparing a semiconductor substrate having a cell transistor area, a high voltage transistor area, and a low voltage transistor area, and forming at least one memory storage pattern defining a cell gate insulating area on the semiconductor substrate within the cell transistor area. An oxidation barrier layer is formed on the semiconductor substrate within the cell gate insulating area, the high voltage transistor area, and the low voltage transistor area. The oxidation barrier layer is patterned to expose the semiconductor substrate within the high voltage transistor area. A lower gate insulating layer is formed on the semiconductor substrate within the high voltage transistor area. A conformal upper insulating layer is formed on a surface of the semiconductor substrate having the memory storage pattern, the oxidation barrier layer, and the lower gate insulating layer. The upper insulating layer and the oxidation barrier layer are partially etched to expose the semiconductor substrate within the low voltage transistor area. A low voltage gate insulating layer of a thickness that is less than a combined thickness of the upper insulating layer and the lower gate insulating layer, is formed on the semiconductor substrate within the low voltage transistor area.

The at least one memory storage pattern may be formed of a first memory storage pattern and a second memory storage pattern which are spaced from each other by the cell gate insulating area. In this case, when a local SONOS cell allowing two-bit operation to be implemented needs to be fabricated, the two memory storage patterns as described above are formed on the semiconductor substrate within the cell transistor area. On the contrary, when a local SONOS cell allowing one-bit operation to be implemented needs to be fabricated, only one selected between the first and second memory storage patterns is formed on the semiconductor substrate within the cell transistor area.

The memory storage pattern may be formed of a tunnel insulating layer pattern and a charge trapping pattern which are sequentially stacked. The tunnel insulating layer pattern may be formed of a silicon oxide layer or a silicon oxynitride (SiON) layer using a thermal oxidation method. Alternatively, the tunnel insulating layer pattern may be formed of a high-k dielectric layer, for example, an aluminum oxide layer (AlO) or a hafnium oxide (HfO) layer using a chemical vapor deposition (CVD) method or an atomic layer deposition (ALD) method. The charge trapping pattern may be formed of a silicon nitride layer (SiN) or a boron nitride layer (BN) using a chemical vapor deposition (CVD) method. Alternatively, the charge trapping pattern may be formed of a high-k dielectric layer, for example, an aluminum oxide layer (AlO) or a hafnium oxide (HfO) layer using a chemical vapor deposition (CVD) method or an atomic layer deposition (ALD) method.

The oxidation barrier layer may be formed of a silicon oxynitride layer using a thermal oxidation method.

The lower gate insulating layer may be formed of a silicon oxide layer using a thermal oxidation method.

The upper insulating layer may be formed of a silicon oxide layer or a silicon oxynitride layer.

The low voltage gate insulating layer may be formed of a silicon oxide layer or a silicon oxynitride layer.

A conductive layer may be formed on the entire surface of the semiconductor substrate having the upper insulating layer and the low voltage gate insulating layer. The conductive layer may be patterned to form a control gate electrode, a high voltage gate electrode, and a low voltage gate electrode within the cell transistor area, the high voltage transistor area, and the low voltage transistor area, respectively.

The oxidation barrier layer and the upper insulating layer which are sequentially stacked between the semiconductor substrate and the control gate electrode may operate as a cell gate insulating layer, and the lower gate insulating layer and the upper insulating layer which are sequentially stacked between the semiconductor substrate and the high voltage gate electrode may operate as a high voltage gate insulating layer. The high voltage gate insulating layer may be formed thicker than the cell gate insulating layer, and the low voltage gate insulating layer may be formed thinner than the high voltage gate insulating layer.

The semiconductor substrate may further include a middle voltage transistor area. In this case, a middle voltage gate insulating layer may be formed on the semiconductor substrate within the middle voltage transistor area. The middle voltage gate insulating layer may be formed thinner than the high voltage gate insulating layer, and the low voltage gate insulating layer may be formed thinner than the middle voltage gate insulating layer.

In another aspect, a method of fabricating a non-volatile memory device includes providing a semiconductor substrate having a cell transistor area, a high voltage transistor area, and a low voltage transistor area, and forming at least one memory storage pattern defining a cell gate insulating area on the semiconductor substrate within the cell transistor area. A lower gate insulating layer is formed on the semiconductor substrate within the cell gate insulating area, the high voltage transistor area, and the low voltage transistor area. The lower gate insulating layer is patterned to expose the semiconductor substrate within the cell gate insulating area and the low voltage transistor area. A conformal upper insulating layer is formed on the entire surface of the semiconductor substrate having the memory storage pattern and the lower gate insulating layer. The upper insulating layer is partially etched to expose the semiconductor substrate within the low voltage transistor area. A low voltage gate insulating layer, of a thickness that is less than the combined thickness of the upper insulating layer and the lower gate insulating layer, is formed on the semiconductor substrate within the low voltage transistor area.

An oxidation barrier layer may be further formed on the semiconductor substrate exposed within the cell gate insulating area prior to formation of the conformal upper insulating layer. The oxidation barrier layer may be formed of a silicon oxynitride layer using a thermal oxidation method.

The lower gate insulating layer may be formed of a silicon oxide layer or a silicon oxynitride layer.

A conductive layer may be formed on the entire surface of the semiconductor substrate having the upper insulating layer and the low voltage gate insulating layer. The conductive layer may be patterned to form a control gate electrode, a high voltage gate electrode, and a low voltage gate electrode, within the cell transistor area, the high voltage transistor area, and the low voltage transistor area, respectively.

The oxidation barrier layer and the upper insulating layer which are sequentially stacked between the semiconductor substrate and the control gate electrode may operate as a cell gate insulating layer, and the lower gate insulating layer and the upper insulating layer which are sequentially stacked between the semiconductor substrate and the high voltage gate electrode may operate as a high voltage gate insulating layer. The high voltage gate insulating layer may be formed thicker than the cell gate insulating layer, and the low voltage gate insulating layer may be formed thinner than the high voltage gate insulating layer.

In still another aspect, a method of fabricating a non-volatile memory device includes providing a semiconductor substrate having a cell transistor area, a high voltage transistor area, and a low voltage transistor area, and forming at least one memory storage pattern defining a cell gate insulating area on the semiconductor substrate within the cell transistor area. A lower gate insulating layer is formed on the semiconductor substrate within the cell gate insulating area, the high voltage transistor area, and the low voltage transistor area. The lower gate insulating layer is patterned to expose the semiconductor substrate within the cell gate insulating area and the low voltage transistor area. An oxidation barrier layer is formed on the exposed semiconductor substrate. A conformal upper insulating layer is formed on the entire surface of the semiconductor substrate having the memory storage pattern, the lower gate insulating layer, and the oxidation barrier layer. The upper insulating layer and the oxidation barrier layer are partially etched to expose the semiconductor substrate within the low voltage transistor area. A low voltage gate insulating layer, of a thickness that is less than the combined thickness of the upper insulating layer and the lower gate insulating layer, is formed on the semiconductor substrate within the low voltage transistor area.

The oxidation barrier layer may be formed of a silicon oxynitride layer using a thermal oxidation method.

The lower gate insulating layer may be formed of a silicon oxide layer or a silicon oxynitride layer.

A conductive layer may be formed on the entire surface of the semiconductor substrate having the upper insulating layer and the low voltage gate insulating layer. The conductive layer may be patterned to form a control gate electrode, a high voltage gate electrode, and a low voltage gate electrode, within the cell transistor area, the high voltage transistor area, and the low voltage transistor area, respectively.

The oxidation barrier layer and the upper insulating layer which are sequentially stacked between the semiconductor substrate and the control gate electrode may operate as a cell gate insulating layer, and the lower gate insulating layer and the upper insulating layer which are sequentially stacked between the semiconductor substrate and the high voltage gate electrode may operate as a high voltage gate insulating layer. The high voltage gate insulating layer may be formed thicker than the cell gate insulating layer, and the low voltage gate insulating layer may be formed thinner than the high voltage gate insulating layer.

BRIEF DESCRIPTION OF THE DRAWINGS

The foregoing and other objects, features and advantages of the invention will be apparent from the more particular description of a preferred embodiment of the invention, as illustrated in the accompanying drawings. The drawings are not necessarily to scale, emphasis instead being placed upon illustrating the principles of the invention.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and areas are exaggerated for clarity. In addition, when a layer is described to be formed on other layer or on a substrate, which means that the layer may be formed on the other layer or on the substrate, or a third layer may be interposed between the layer and the other layer or the substrate. Like numbers refer to like elements throughout the specification.

FIGS. 1 to 11 are process cross-sectional views of respective fabrication steps for explaining methods of fabricating a non-volatile memory device in accordance with embodiments of the present invention.

Figure 1:
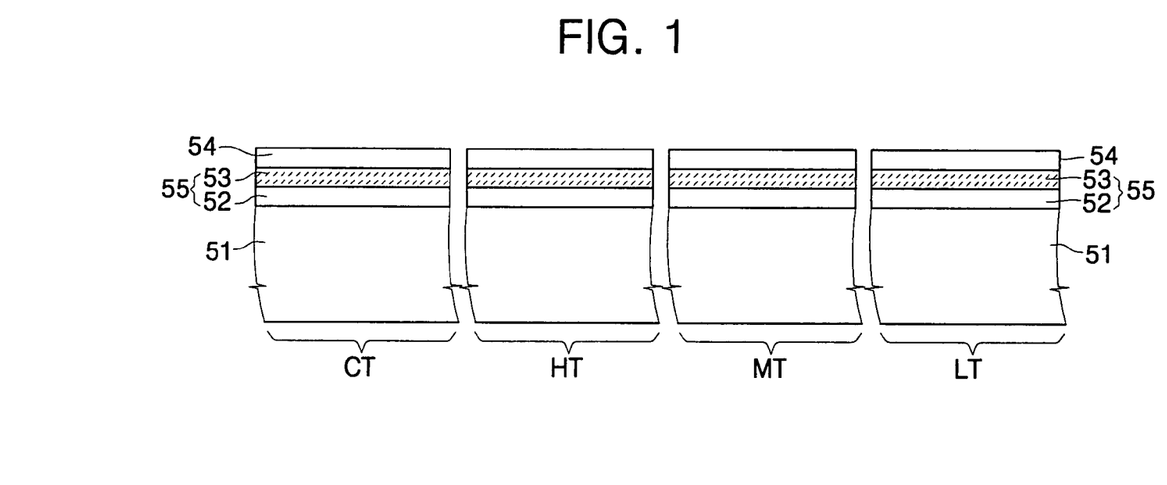
FIGS. 1 to 11 are process cross-sectional views of respective fabrication steps for methods of fabricating a non-volatile memory device in accordance with embodiments of the present invention.

Referring to FIG. 1, a semiconductor substrate 51 having a cell transistor area CT, a high voltage transistor area HT, and a low voltage transistor area LT is prepared. The semiconductor substrate 51 may further include a middle voltage transistor area MT. In addition, the semiconductor substrate 51 may be a silicon wafer. Typically, an isolation layer defining an active area is already formed in the semiconductor substrate 51, however it is not shown for simplicity of description.

A memory storage layer 55 having a tunnel insulating layer 52 and a charge trapping layer 53 which are sequentially stacked is formed on the entire surface of the semiconductor substrate 51. A buffer layer 54 is formed on the surface of the memory storage layer 55.

The tunnel insulating layer 52 forming a lower portion of the memory storage layer 55 may be formed of a silicon oxide layer or a silicon oxynitride (SiON) layer using a thermal oxidation method. Alternatively, the tunnel insulating layer 52 may be formed of a high-k dielectric layer, for example, an aluminum oxide (AlO) layer or a hafnium oxide (HfO) layer using a chemical vapor deposition (CVD) method or an atomic layer deposition method. The tunnel insulating layer 52 may be formed to a thickness of 20 Å to 70 Å. In addition, the charge trapping layer 53 forming an upper portion of the memory storage layer 55 may be formed of a silicon nitride (SiN) layer or a boron nitride (BN) layer using a CVD method. Alternatively, the charge trapping layer 53 may be formed of a high-k dielectric layer, for example, an aluminum oxide (AlO) layer or a hafnium oxide (HfO) layer using a CVD method or an atomic layer deposition method. The charge trapping layer 53 may be formed to a thickness of 30 Å to 100 Å. The buffer layer 54 may be formed of a silicon oxide layer or a silicon oxynitride (SiON) layer using a thermal oxidation method or a CVD method. The buffer layer 54 may be formed to a thickness of 40 Å to 100 Å.

Figure 2:
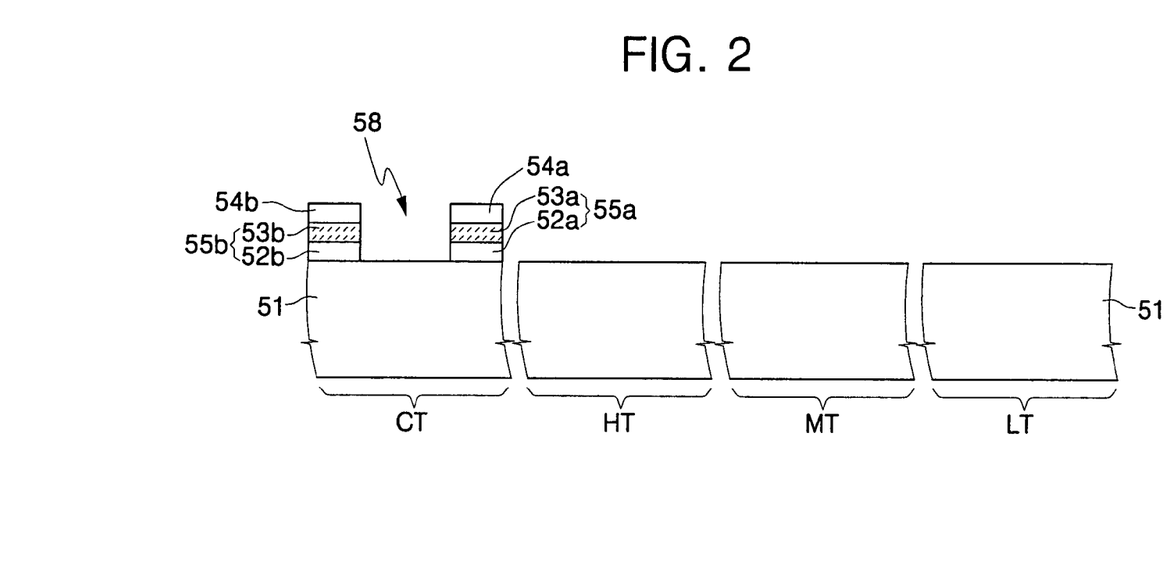

Referring to FIG. 2, memory storage patterns 55a and 55b defining a cell gate insulating area 58 are formed on the semiconductor substrate 51 within the cell transistor area CT. The buffer layer 54, the charge trapping layer 53, and the tunnel insulating layer 52 are selectively patterned to form the cell gate insulating area 58 exposing the semiconductor substrate 51 in some area of the cell transistor area CT and to expose the semiconductor substrate 51 within the high voltage transistor area HT, the middle voltage transistor area MT, and the low voltage transistor area LT at the same time. As a result, centering around the cell gate insulating area 58, a first memory storage pattern 55a, formed of a first tunnel insulating layer pattern 52a and a first charge trapping pattern 53a, is formed at one side within the cell transistor area CT, and a second memory storage pattern 55b, formed of a second tunnel insulating layer pattern 52b and a second charge trapping pattern 53b, is formed at the other side within the cell transistor area CT. In addition, a first buffer layer pattern 54a is formed on the first memory storage pattern 55a, and a second buffer layer pattern 54b is formed on the second memory storage pattern 55b. A process for patterning the buffer layer 54, the charge trapping layer 53, and the tunnel insulating layer 52 includes forming a photoresist pattern (not shown) covering the buffer layer 54, anisotropically etching the buffer layer 54, the charge trapping layer 53, and the tunnel insulating layer 52 using the photoresist pattern as an etch mask, and removing the photoresist pattern.

In this case, when the local SONOS cell allowing two-bit operation to be implemented is fabricated, the cell gate insulating area 58 is formed in a center of the cell transistor area CT while the first memory storage pattern 55a and the second memory storage pattern 55b are formed at one side and the other side of the center, respectively, as shown in FIG. 2. On the contrary, when the local SONOS cell allowing one-bit operation to be implemented is fabricated, only one selected between the first and second memory storage patterns 55a and 55b is formed while the other is removed to expose the semiconductor substrate 51.

Hereinafter, it is assumed that the local SONOS cell is fabricated which allows the two-bit operation to be implemented.

Figure 3:
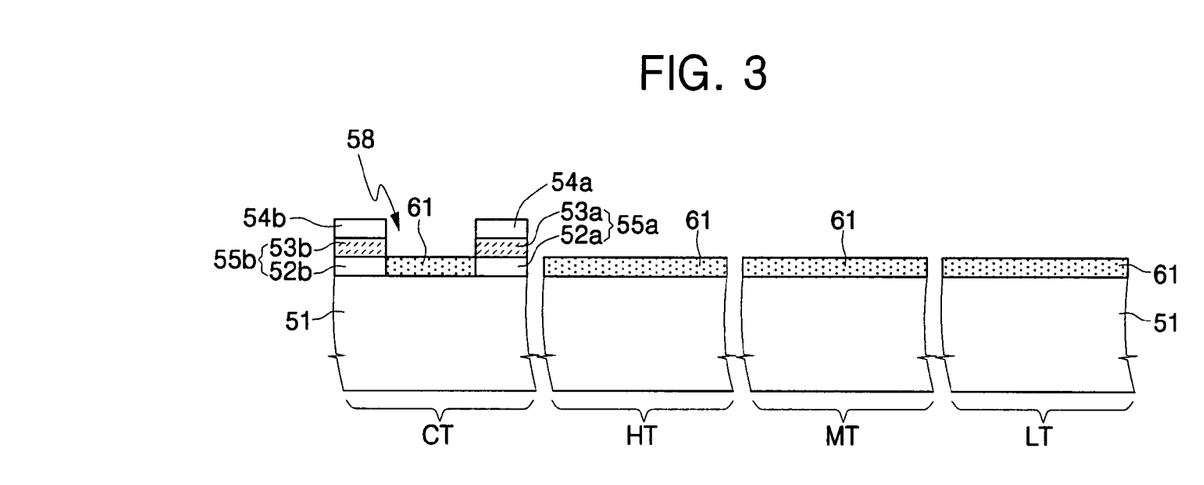

Referring to FIG. 3, a cleaning process for removing etching sludge present on the semiconductor substrate 51 can be performed. An oxidation barrier layer 61 is optionally formed on the surface of the semiconductor substrate 51 exposed within the cell gate insulating area 58, the high voltage transistor area HT, the middle voltage transistor area MT, and the low voltage transistor area LT. The oxidation barrier layer 61 can be formed of a silicon oxynitride (SiON) layer using a thermal oxidation method. When the oxidation barrier layer 61 is formed by the thermal oxidation method, the oxidation barrier layer 61 is selectively formed only on the semiconductor substrate 51 exposed within the cell gate insulating area 58, the high voltage transistor area HT, the middle voltage transistor area MT, and the low voltage transistor area LT. On the contrary, when a nitride layer such as a silicon oxynitride (SiON) layer, a silicon nitride (SiN) layer, or a boron nitride (BN) layer is formed within the memory storage patterns 55a and 55b, a layer is not formed on the memory storage patterns 55a and 55b. The oxidation barrier layer 61 may be formed to a thickness of 1 Å to 30 Å. Alternatively, the oxidation barrier layer 61 may be omitted.

Figure 4:
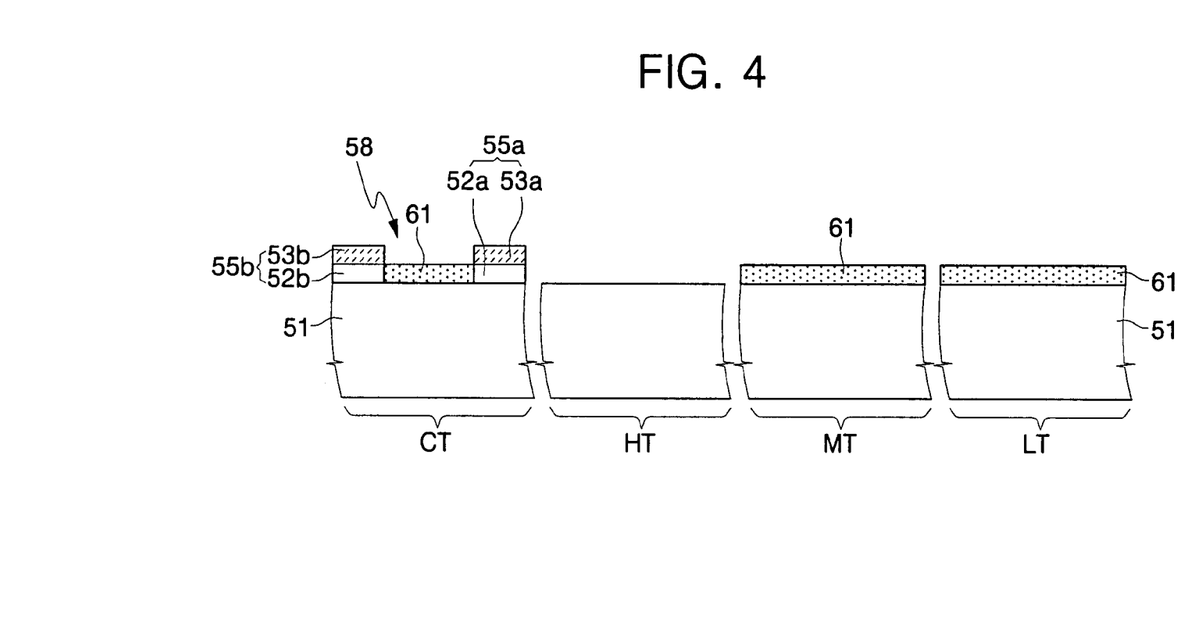

Referring to FIG. 4, the oxidation barrier layer 61 is selectively patterned to expose the semiconductor substrate 51 within the high voltage transistor area HT. A process for patterning the oxidation barrier layer 61 includes forming a photoresist pattern (not shown) covering the semiconductor substrate 51 where the oxidation barrier layer 61 is already formed, etching the oxidation barrier layer 61 using the photoresist pattern as an etch mask, and removing the photoresist pattern.

After removing the photoresist pattern, a cleaning process for removing etching sludge present on the semiconductor substrate 51 is carried out. The buffer layer patterns 54a and 54b may be etched together while the cleaning processes are carried out so that the buffer layer patterns may become thinner or completely removed. The thickness of the buffer layer patterns 54a and 54b remaining after etching may be adjusted to be within the range of 1 Å to 50 Å. However, the buffer layer patterns 54a and 54b remaining after etching may have a layer quality where the thickness is not uniform, so that it is preferable to completely remove them.

Figure 5:
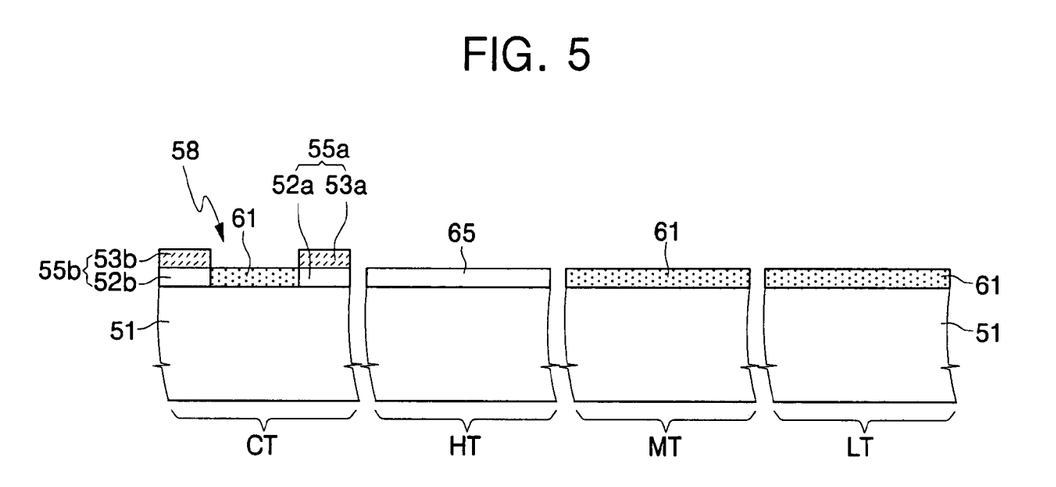

Referring to FIG. 5, a lower gate insulating layer 65 is formed on the semiconductor substrate 51 within the high voltage transistor area HT. The lower gate insulating layer 65 may be formed to a thickness of 50 Å to 80 Å using a thermal oxidation method. When the lower gate insulating layer 65 is formed using the thermal oxidation method, the lower gate insulating layer 65 is selectively formed only on the semiconductor substrate 51 exposed within the high voltage transistor area HT. On the contrary, when a nitride layer such as a silicon oxynitride (SiON) layer, a silicon nitride (SiN) layer, or a boron nitride (BN) layer is formed within the memory storage patterns 55a and 55b and the silicon oxynitride (SiON) layer is formed on the semiconductor substrate 51 within the cell gate insulating area 58, the middle voltage transistor area MT, and the low voltage transistor area LT, layer formation is suppressed on the semiconductor substrate 51 within the cell transistor area CT, the middle voltage transistor area MT, and the low voltage transistor area LT.

Alternatively, in methods of fabricating a non-volatile memory device in accordance with other embodiments of the present invention, as described with reference to FIG. 3, when the oxidation barrier layer 61 is omitted, the lower gate insulating layer 65 is formed by the thermal oxidation method on the semiconductor substrate 51 exposed within the cell gate insulating area 58, the high voltage transistor area HT, the middle voltage transistor area MT, and the low voltage transistor area LT. Alternatively, when the oxidation barrier layer 61 is omitted, the lower gate insulating layer 65 may be formed of a silicon oxide layer or a silicon oxynitride (SiON) layer using a CVD method. The lower gate insulating layer 65 is then selectively patterned to expose the semiconductor substrate 51 within the cell gate insulating area 58, the middle voltage transistor area MT, and the low voltage transistor area LT.

Alternatively, in methods of fabricating a non-volatile memory device in accordance still other embodiments of the present invention, when the oxidation barrier layer 61 is omitted, the lower gate insulating layer 65 is formed by the thermal oxidation method on the semiconductor substrate 51 exposed within the cell gate insulating area 58, the high voltage transistor area HT, the middle voltage transistor area MT, and the low voltage transistor area LT. Alternatively, when the oxidation barrier layer 61 is omitted, the lower gate insulating layer 65 may be formed of a silicon oxide layer or a silicon oxynitride (SiON) layer using a CVD method. The lower gate insulating layer 65 is then selectively patterned to expose the semiconductor substrate 51 within the cell gate insulating area 58, the middle voltage transistor area MT, and the low voltage transistor area LT. Subsequently, the semiconductor substrate 51 can be thermally oxidized to form the oxidation barrier layer 61 on the semiconductor substrate 51 exposed within the cell gate insulating area 58, the middle voltage transistor area MT, and the low voltage transistor area LT. The oxidation barrier layer 61 can be formed of a silicon oxynitride (SiON) layer by a thermal oxidation method. When the oxidation barrier layer 61 is formed of the silicon oxynitride (SiON) layer by the thermal oxidation method, the oxidation barrier layer 61 is selectively formed only on the semiconductor substrate 51 exposed within the cell gate insulating area 58, the middle voltage transistor area MT, and the low voltage transistor area LT. The oxidation barrier layer 61 may be formed to a thickness of 1 Å to 30 Å.

Figure 6:
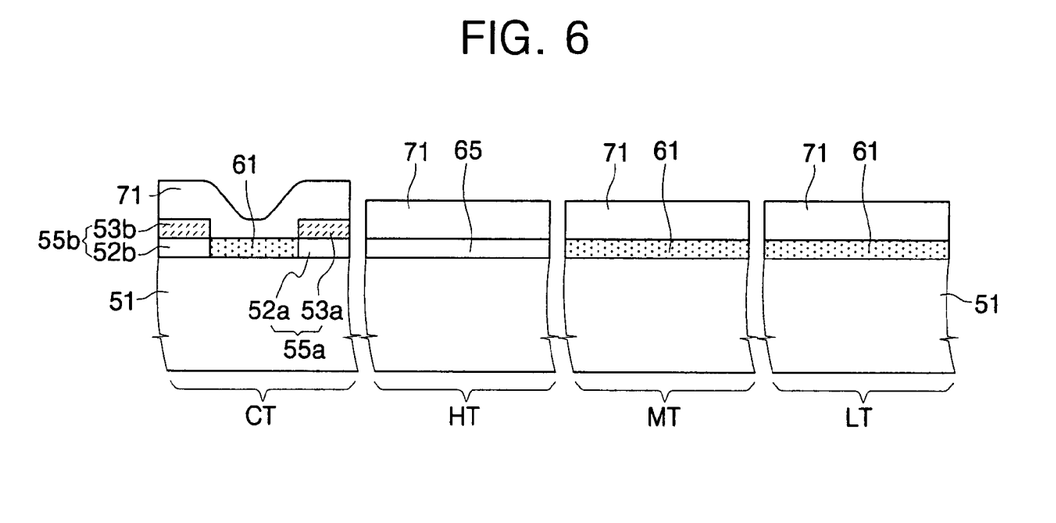

Referring to FIG. 6, a conformal upper insulating layer 71 is formed on the entire surface of the semiconductor substrate 51 having the memory storage patterns 55a and 55b and the lower gate insulating layer 65. The upper insulating layer 71 may be formed of a silicon oxide layer or a silicon oxynitride (SiON) layer using a CVD method.

Alternatively, in methods of fabricating a non-volatile memory device in accordance with still other embodiments of the present invention, when the oxidation barrier layer 61 is omitted as described with reference to FIG. 3, the upper insulating layer 71 is formed so as to cover the memory storage patterns 55a and 55b and the lower gate insulating layer 65. At the same time, the upper insulating layer 71 is also formed on the surface of the semiconductor substrate 51 exposed within the cell gate insulating area 58, the middle voltage transistor area MT, and the low voltage transistor area LT.

Figure 7:
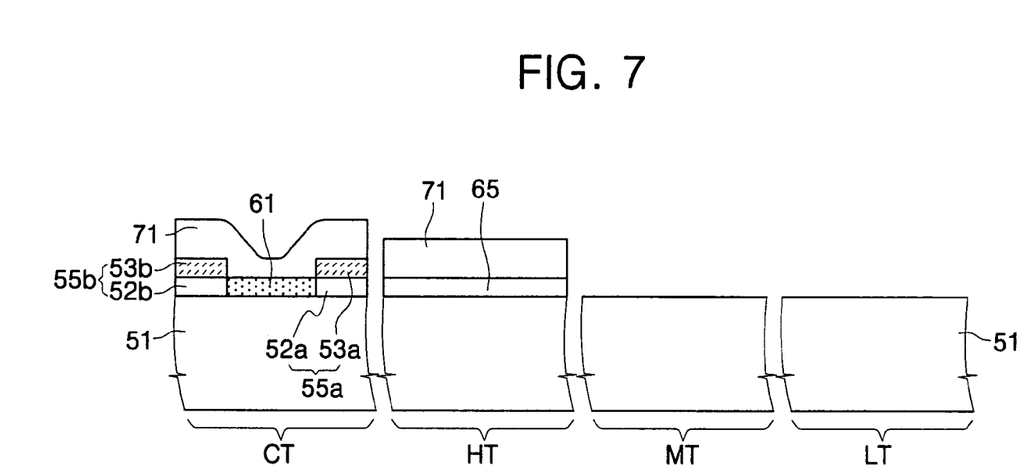

Referring to FIG. 7, the upper insulating layer 71 and the oxidation barrier layer 61 are selectively patterned to expose the semiconductor substrate 51 within the middle voltage transistor area MT and the low voltage transistor area LT. As a result, the upper insulating layer 71 may be patterned to remain only within the cell transistor area CT and the high voltage transistor area HT.

Figure 8:
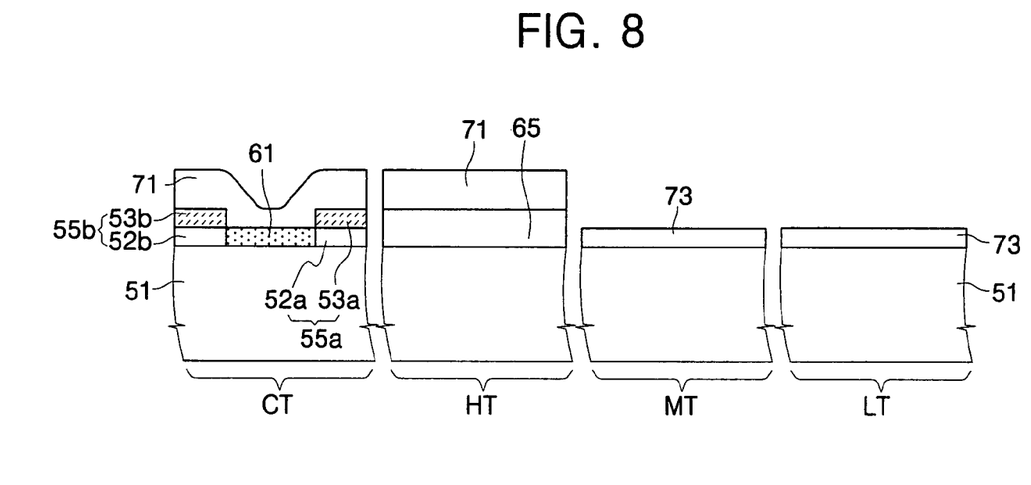

Referring to FIG. 8, a middle voltage gate insulating layer 73 is formed on the semiconductor substrate 51 exposed within the middle voltage transistor area MT and the low voltage transistor area LT. The middle voltage gate insulating layer 73 may be formed of a silicon oxide layer or a silicon oxynitride (SiON) layer using a thermal oxidation method or a CVD method. For example, when the upper insulating layer pattern 71a and the lower gate insulating layer 65 are silicon oxide layers, the lower gate insulating layer 65 may become thicker when the middle voltage gate insulating layer 73 is formed of a silicon oxide layer using the thermal oxidation method.

Figure 9:
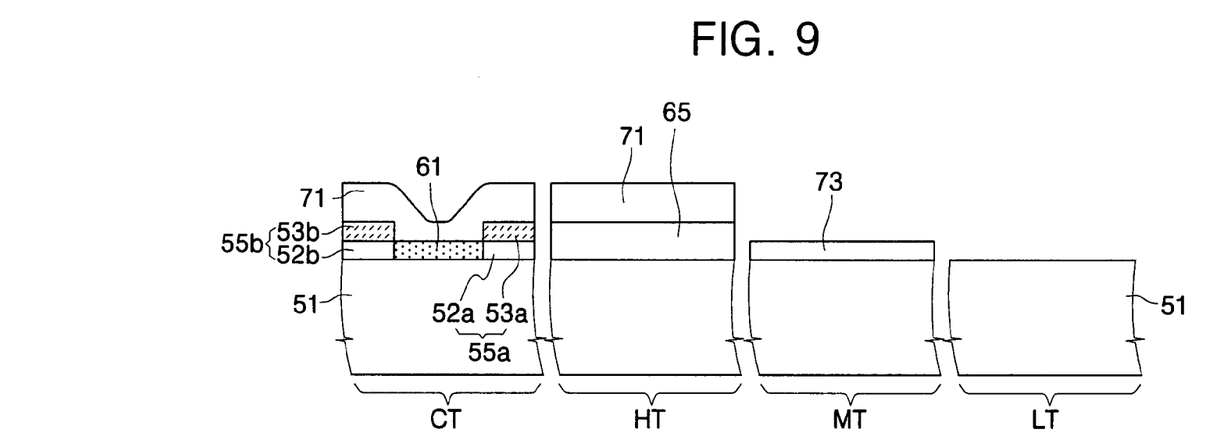

Referring to FIG. 9, the middle voltage gate insulating layer 73 is selectively patterned to expose the semiconductor substrate 51 within the low voltage transistor area LT.

Figure 10:
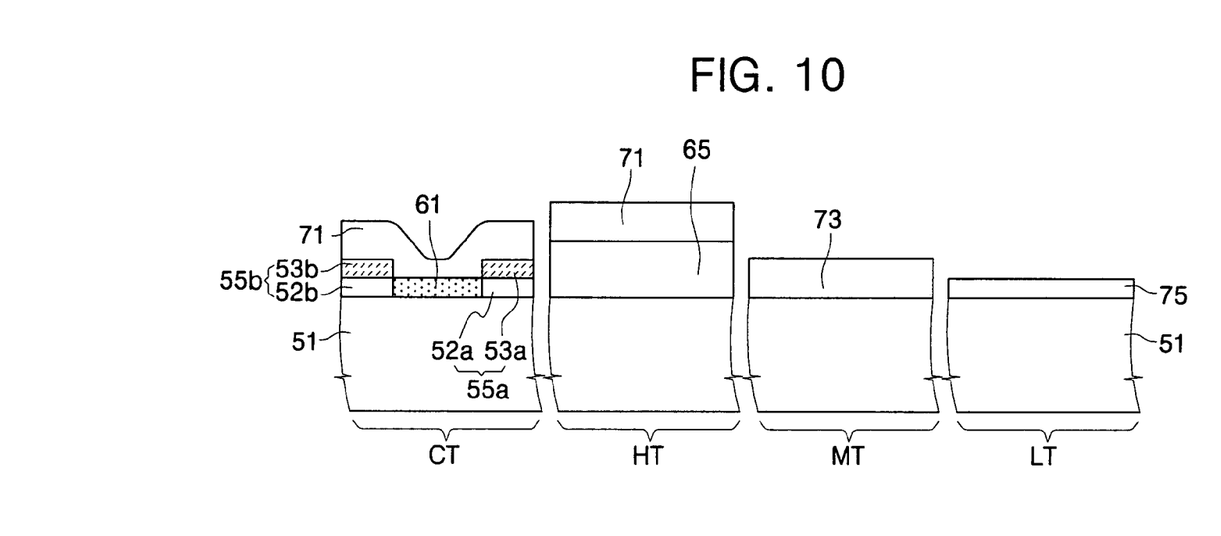

Referring to FIG. 10, a low voltage gate insulating layer 75 is formed on the semiconductor substrate 51 exposed within the low voltage transistor area LT. The low voltage gate insulating layer 75 may be formed of a silicon oxide layer or a silicon oxynitride (SiON) layer using a thermal oxidation method. For example, when the middle voltage gate insulating layer 73 is a silicon oxide layer, the middle voltage gate insulating layer 73 may become thicker when the low voltage gate insulating layer 75 is formed of a silicon oxide layer using the thermal oxidation method.

Figure 11:
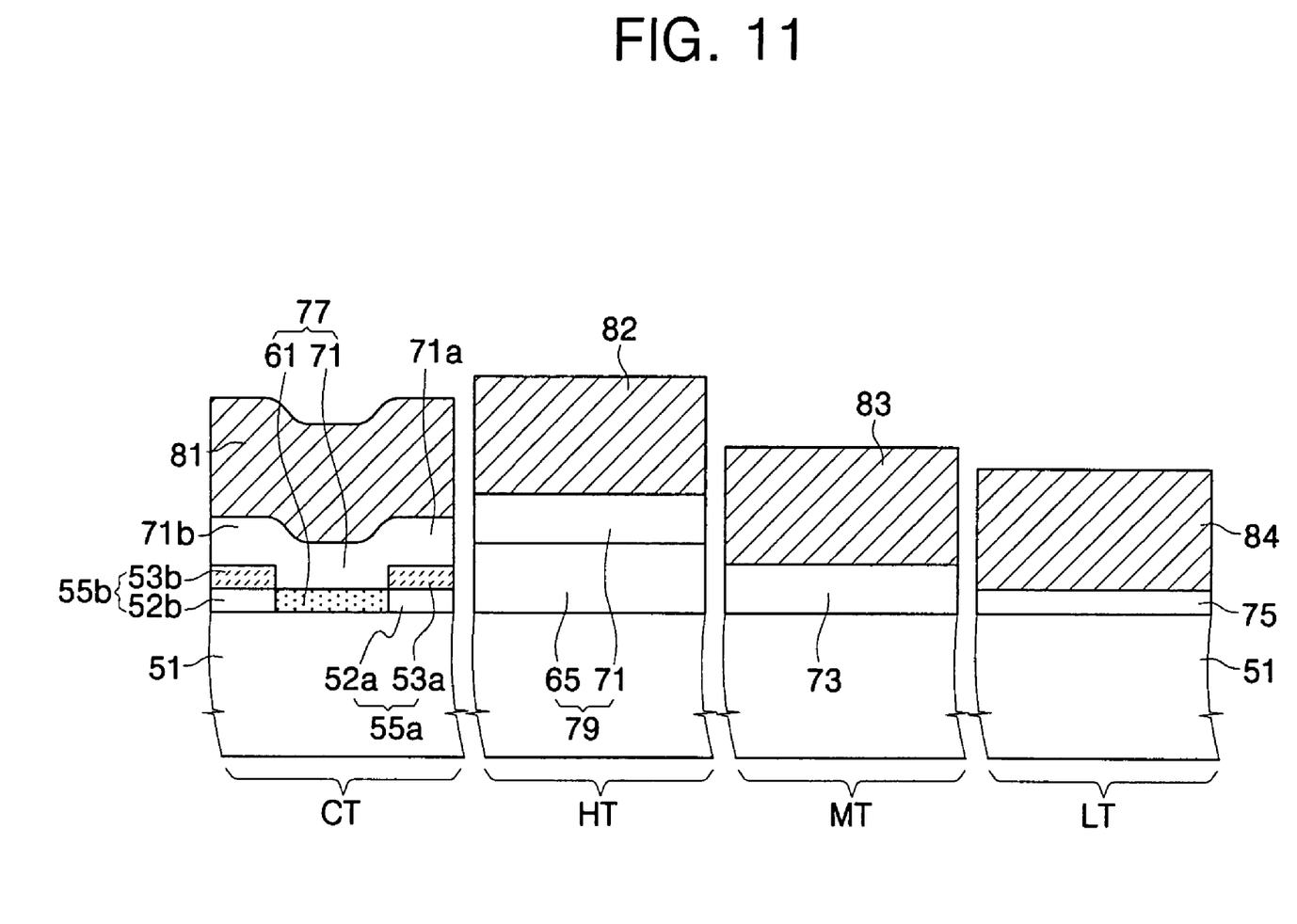

Referring to FIG. 11, a conductive layer is formed on the entire surface of the semiconductor substrate 51 having the upper insulating layer 71, the middle voltage gate insulating layer 73, and the low voltage gate insulating layer 75. The conductive layer is patterned to form a control gate electrode 81, a high voltage gate electrode 82, a middle voltage gate electrode 83, and a low voltage gate electrode 84, within the cell transistor area CT, the high voltage transistor area HT, the middle voltage transistor area MT, and the low voltage transistor area LT, respectively.

As a result, a cell transistor to be formed within the cell transistor area CT includes the control gate electrode 81 formed on the semiconductor substrate 51. The oxidation barrier layer 61 and the upper insulating layer 71 which are sequentially stacked between the semiconductor substrate 51 and the control gate electrode 81 operates as a cell gate insulating layer 77 of the cell transistor, and the upper insulating layer 71 formed between the first and second memory storage patterns 55a and 55b and the control gate electrode 81 operates as first and second blocking layers 71a and 71b.

In addition, the lower gate insulating layer 65 and the upper insulating layer 71 which are sequentially stacked between the semiconductor substrate 51 and the high voltage gate electrode 82 operate as a high voltage gate insulating layer 79. A high voltage transistor formed within the high voltage transistor area HT includes the high voltage gate electrode 82 and the high voltage gate insulating layer 79 formed on the semiconductor substrate 51.

When the transistors are fabricated in accordance with embodiments of the present invention, the high voltage gate insulating layer 79 can be formed thicker than the cell gate insulating layer 77, the middle voltage gate insulating layer 73 can be formed thinner than the high voltage gate insulating layer 79, and the low voltage gate insulating layer 75 can be formed thinner than the middle voltage gate insulating layer 73.

Figure 12:
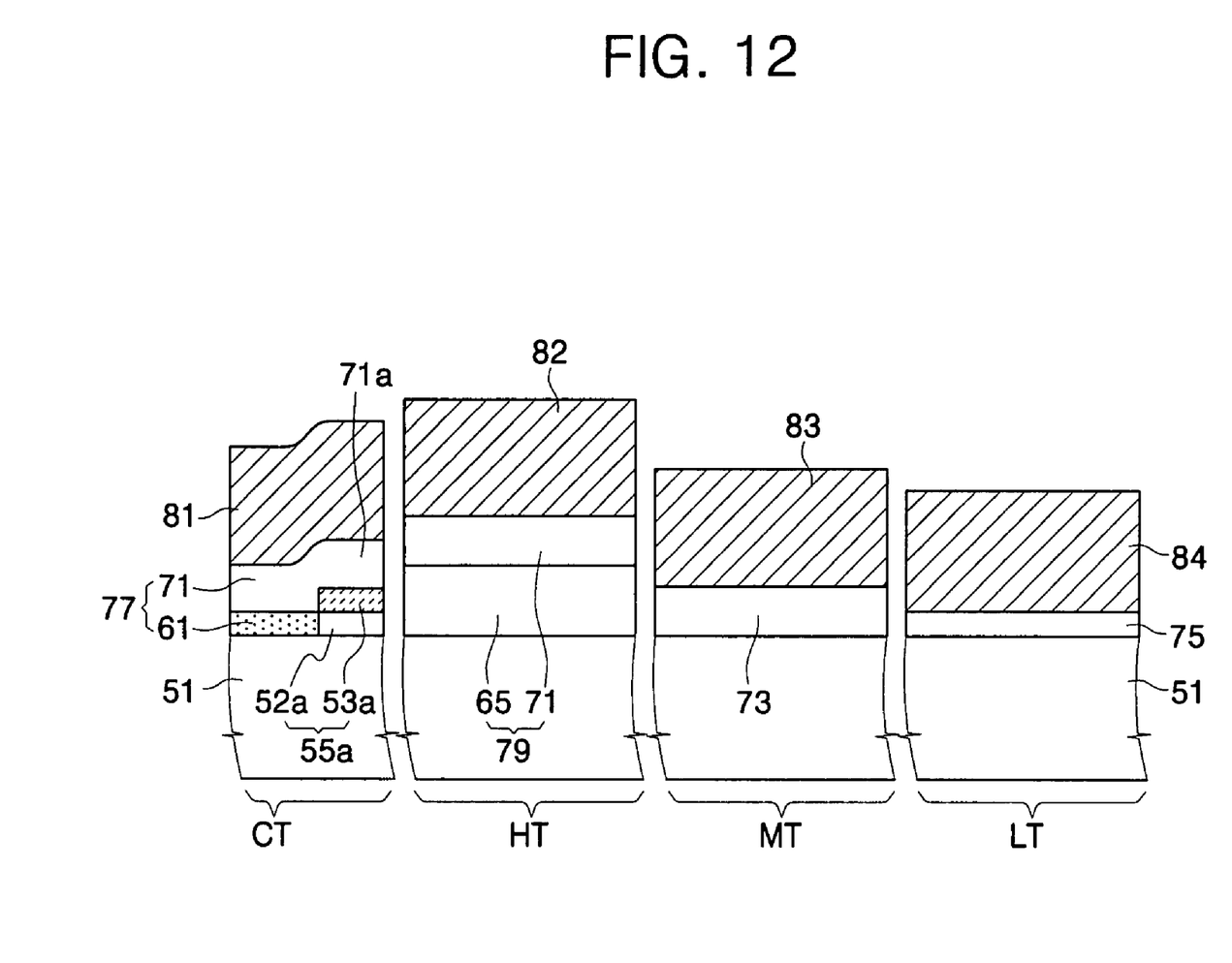
FIG. 12 is a cross-sectional view illustrating the fabrication of a non-volatile memory device having a local SONOS gate structure of one-bit operation in accordance with embodiments of the present invention.

FIG. 12 is a cross-sectional view for explaining methods of fabricating a non-volatile memory device having a local SONOS gate structure of one-bit operation in accordance with embodiments of the present invention.

Referring to FIG. 12, when the local SONOS cell allowing one-bit operation to be implemented is fabricated, as described with reference to FIG. 2, only one selected memory storage pattern 55a is formed on the semiconductor substrate 51 within the cell transistor area CT. Hereinafter, a non-volatile memory device having a local SONOS gate structure allowing one-bit operation to be implemented may be fabricated by the same method as that described with reference to FIGS. 3 to 11.

In detail, a memory storage pattern 55a defining a cell gate insulating area is formed on a semiconductor substrate 51 within the cell transistor area CT. An oxidation barrier layer 61 may be formed on the semiconductor substrate 51 within the cell gate insulating area 58. An upper insulating layer 71 is formed to cover the oxidation barrier layer 61 and the memory storage pattern 55a. A control gate electrode 81 is formed on the upper insulating layer 71. In this case, the oxidation barrier layer 61 and the upper insulating layer 71 which are sequentially stacked on the semiconductor substrate 51 within the cell gate insulating area 58 operate as a cell gate insulating layer 77, and the upper insulating layer 71 formed between the memory storage pattern 55a and the control gate electrode 81 operates as a blocking layer 71a. At the same time, a lower gate insulating layer 65, the upper insulating layer 71, and a high voltage gate electrode 82 which are sequentially stacked are formed on the semiconductor substrate 51 within the high voltage transistor area HT. In this case, the lower gate insulating layer 65 and the upper insulating layer 71 which are sequentially stacked operate as a high voltage gate insulating layer 79. The high voltage gate insulating layer 79 may be formed thicker than the cell gate insulating layer 77. In addition, a middle voltage gate insulating layer 73 and a middle voltage gate electrode 83 which are sequentially stacked may be formed on the semiconductor substrate 51 within the middle voltage transistor area MT. The middle voltage gate insulating layer 73 may be formed thinner than the high voltage gate insulating layer 79. In addition, a low voltage gate insulating layer 75 and a low voltage gate electrode 84 which are sequentially stacked are formed on the semiconductor substrate 51 within the low voltage transistor area LT. The low voltage gate insulating layer 75 can be formed thinner than the middle voltage gate insulating layer 73.

Figure 13:
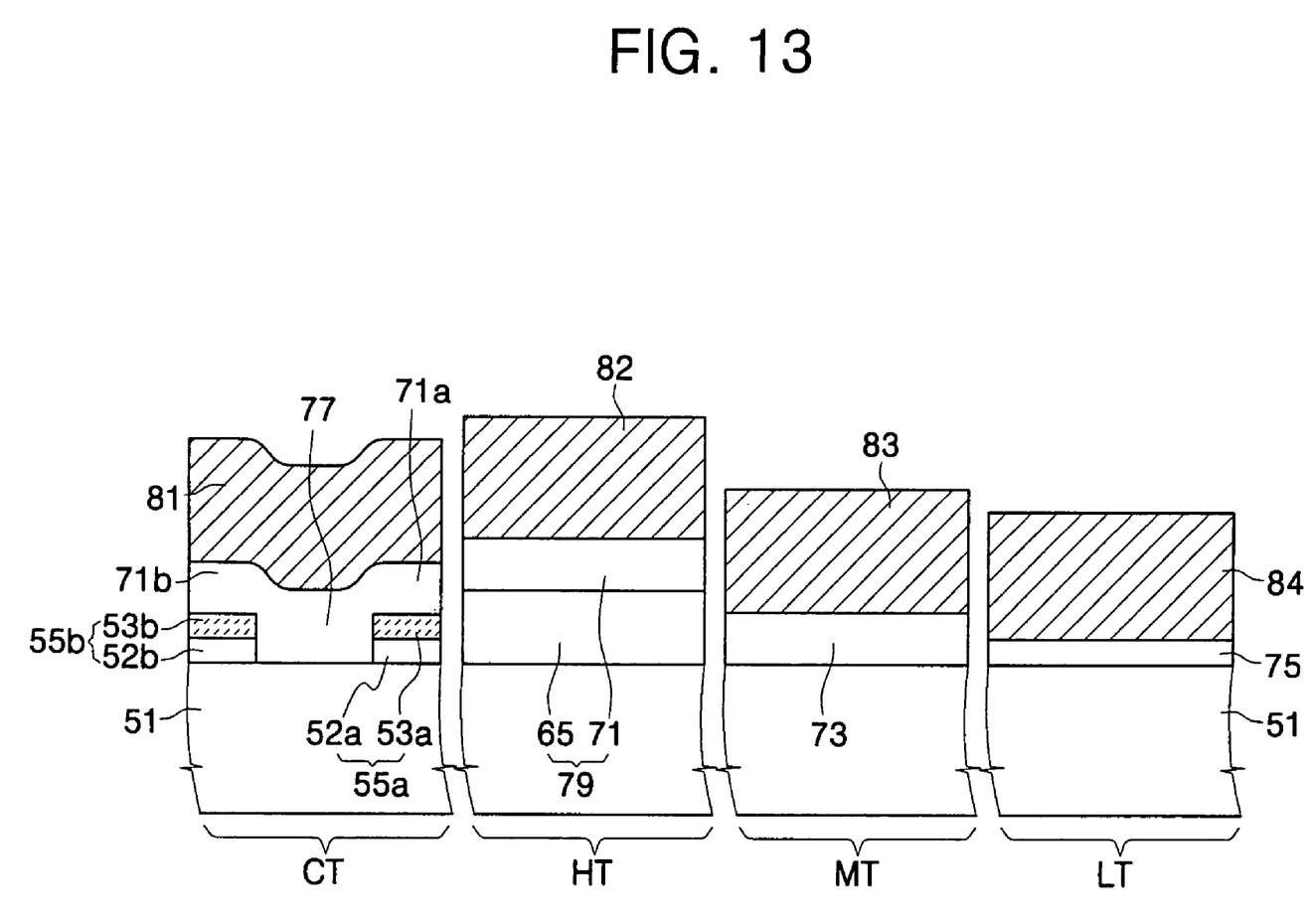
FIGS. 13 and 14 are cross-sectional views illustrating methods of fabricating a non-volatile memory device having a local SONOS gate structure in accordance with other embodiments of the present invention.
Figure 14:
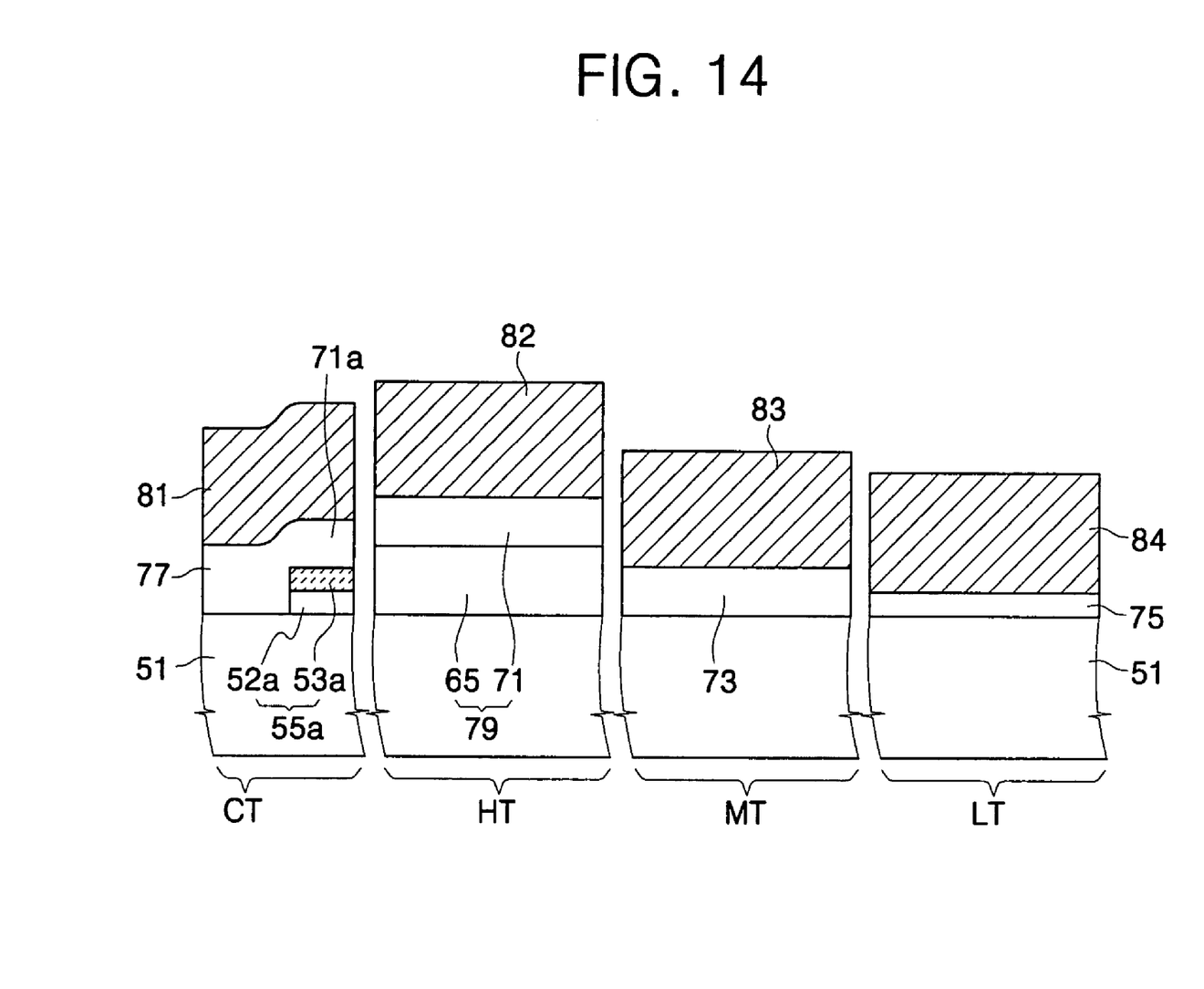

FIGS. 13 and 14 are cross-sectional views for explaining methods of fabricating a non-volatile memory device having a local SONOS gate structure in accordance with other embodiments of the present invention. FIG. 13 is a cross-sectional view for explaining methods of fabricating a non-volatile memory device having a local SONOS gate structure allowing two-bit operation to be implemented in accordance with other embodiments of the present invention, and FIG. 14 is a cross-sectional view for explaining methods of fabricating a non-volatile memory device having a local SONOS gate structure allowing one-bit operation to be implemented in accordance with other embodiments of the present invention.

Referring to FIG. 13, in the fabrication methods according to the other embodiments of the present invention, the oxidation barrier layer 61 is omitted as described with reference to FIG. 3, and the lower gate insulating layer 65 is formed on the semiconductor substrate 51 within the high voltage transistor area HT as described with reference to FIG. 5. Subsequently, the non-volatile memory device having the local SONOS gate structure allowing two-bit operation to be implemented may be fabricated by the same method as that described with reference to FIGS. 6 to 11.

In detail, first and second memory storage patterns 55a and 55b defining a cell gate insulating area are formed on a semiconductor substrate 51 within a cell transistor area CT. An upper insulating layer 71 is formed to cover top surfaces of the first and second memory storage patterns 55a and 55b and the semiconductor substrate 51 within the cell gate insulating area. A control gate electrode 81 is formed on the upper insulating layer 71. In this case, the upper insulating layer 71 formed between the control gate electrode 81 and the semiconductor substrate 51 within the cell gate insulating area operates as a cell gate insulating layer 77, and the upper insulating layer 77 formed between the first and second memory storage patterns 55a and 55b and the control gate electrode 81 operates as first and second blocking layers 71a and 71b, respectively. At the same time, a lower gate insulating layer 65, the upper insulating layer 71, and a high voltage gate electrode 82 which are sequentially stacked are formed on the semiconductor substrate 51 within a high voltage transistor area HT. In this case, the lower gate insulating layer 65 and the upper insulating layer 71 which are sequentially stacked operate as a high voltage gate insulating layer 79. The high voltage gate insulating layer 79 may be formed thicker than the cell gate insulating layer 77. In addition, a middle voltage gate insulating layer 73 and a middle voltage gate electrode 83 which are sequentially stacked are formed on the semiconductor substrate 51 within a middle voltage transistor area MT. The middle voltage gate insulating layer 73 may be formed thinner than the high voltage gate insulating layer 79. In addition, a low voltage gate insulating layer 75 and a low voltage gate electrode 84 which are sequentially stacked are formed on the semiconductor substrate 51 within a low voltage transistor area LT. The low voltage gate insulating layer 75 may be formed thinner than the middle voltage gate insulating layer 73.

Referring to FIG. 14, in the fabrication methods according to the other embodiments of the present invention, only one selected memory storage pattern 55a is formed on the semiconductor substrate 51 within the cell transistor area CT as described with reference to FIG. 2. Hereinafter, a non-volatile memory device having a local SONOS gate structure allowing one-bit operation to be implemented may be fabricated by the same method as that described with reference to FIG. 14. That is, the oxidation barrier layer 61 is omitted, and the lower gate insulating layer 65 is formed on the semiconductor substrate 51 within the high voltage transistor area HT.

In detail, a memory storage pattern 55a defining a cell gate insulating area is formed on the semiconductor substrate 51 within the cell transistor area CT. An upper insulating layer 71 is formed to cover top surfaces of the memory storage pattern 55a and the semiconductor substrate 51 within the cell gate insulating area. A control gate electrode 81 is formed on the upper insulating layer 71. In this case, the upper insulating layer 71 formed between the control gate electrode 81 and the semiconductor substrate 51 within the cell gate insulating area operates as a cell gate insulating layer 77, and the upper insulating layer 71 formed between the memory storage pattern 55a and the control gate electrode 81 operates as a blocking layer 71a. At the same time, a lower gate insulating layer 65, an upper insulating layer 71, and a high voltage gate electrode 82 which are sequentially stacked are formed on the semiconductor substrate 51 within the high voltage transistor area HT. In this case, the lower gate insulating layer 65 and the upper insulating layer 71 which are sequentially stacked operate as a high voltage gate insulating layer 79. The high voltage gate insulating layer 79 may be formed thicker than the cell gate insulating layer 77. In addition, a middle voltage gate insulating layer 73 and a middle voltage gate electrode 83 which are sequentially stacked may be formed on the semiconductor substrate 51 within the middle voltage transistor area MT. The middle voltage gate insulating layer 73 may be formed thinner than the high voltage gate insulating layer 79. In addition, a low voltage gate insulating layer 75 and a low voltage gate electrode 84 which are sequentially stacked are formed on the semiconductor substrate 51 within the low voltage transistor area LT. The low voltage gate insulating layer 75 may be formed thinner than the middle voltage gate insulating layer 73.

Subsequently, typical patterning and source/drain forming processes are carried out to fabricate the non-volatile memory device having the local SONOS gate structure.

According to the present invention as mentioned above, an oxidation barrier layer is formed on the semiconductor substrate within the cell gate insulating area. The oxidation barrier layer may be formed of a silicon oxynitride (SiON) layer using a thermal oxidation method. The silicon oxynitride (SiON) layer operates to prevent a thermal oxidation layer from being formed on the semiconductor substrate within the cell gate insulating area during the subsequent process of forming a high voltage gate insulating layer, a middle voltage gate insulating layer, and a low voltage gate insulating layer. Accordingly, the high voltage gate insulating layer may be formed thicker than the cell gate insulating layer, and the middle voltage gate insulating layer and the low voltage gate insulating layer which are thinner than the high voltage gate insulating layer may be formed. Accordingly, a sensing margin of an on/off cell current may be sufficiently ensured while the non-volatile memory device having the local SONOS gate structure may be implemented which allows a peripheral circuit to which a high voltage is applied and delivered to stably operate.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and detail may be made herein without departing from the spirit and scope of the present invention as set forth in the following claims.

What is claimed is:

1. A method of fabricating a non-volatile memory device having a local silicon-oxide-nitride-oxide-silicon (SONOS) gate structure, comprising:
   providing a semiconductor substrate having a cell transistor area, a high voltage transistor area, and a low voltage transistor area;
   forming at least one memory storage pattern defining a cell gate insulating area on the semiconductor substrate within the cell transistor area;
   forming an oxidation barrier layer on the semiconductor substrate within the cell gate insulating area;
   forming a lower gate insulating layer on the semiconductor substrate within the high voltage transistor area;
   forming a conformal upper insulating layer on the memory storage pattern, the oxidation barrier layer, and the lower gate insulating layer; and
   forming a low voltage gate insulating layer to a thickness less than a combined thickness of the upper insulating layer and the lower gate insulating layer on the semiconductor substrate within the low voltage transistor area.

2. The method as recited in claim 1, wherein the at least one memory storage pattern is formed of a first memory storage pattern and a second memory storage pattern which are spaced from each other by the cell gate insulating area.

3. The method as recited in claim 1, wherein the memory storage pattern is formed of a tunnel insulating layer pattern and a charge trapping pattern which are sequentially stacked.

4. The method as recited in claim 3, wherein the tunnel insulating layer pattern is formed of any one of a silicon oxide layer, a silicon oxynitride layer, and a high-k dielectric layer.

5. The method as recited in claim 3, wherein the charge trapping pattern is formed of any one of a silicon nitride layer, a boron nitride layer, and a high-k dielectric layer.

6. The method as recited in claim 1, wherein the upper insulating layer formed on the memory storage pattern operates as a blocking layer.

7. The method as recited in claim 1, wherein the oxidation barrier layer is formed of a silicon oxynitride layer using a thermal oxidation method.

8. The method as recited in claim 1, wherein the lower gate insulating layer is formed of a silicon oxide layer using a thermal oxidation method.

9. The method as recited in claim 1, wherein the upper insulating layer is formed of any one of a silicon oxide layer and a silicon oxynitride layer using a chemical vapor deposition (CVD) method.

10. The method as recited in claim 1, wherein the low voltage gate insulating layer is formed of any one of a silicon oxide layer and a silicon oxynitride layer.

11. The method as recited in claim 1, further comprising:
   forming a conductive layer on an entire surface of the semiconductor substrate having the upper insulating layer and the low voltage gate insulating layer; and
   patterning the conductive layer to form a control gate electrode, a high voltage gate electrode, and a low voltage gate electrode, within the cell transistor area, the high voltage transistor area, and the low voltage transistor area, respectively.

12. The method as recited in claim 11, wherein the oxidation barrier layer and the upper insulating layer which are stacked below the control gate electrode operate as a cell gate insulating layer, and the lower gate insulating layer and the upper insulating layer which are stacked below the high voltage gate electrode operate as a high voltage gate insulating layer.

13. The method as recited in claim 12, wherein the high voltage gate insulating layer is formed thicker than the cell gate insulating layer.

14. A method of fabricating a non-volatile memory device having a local silicon-oxide-nitride-oxide-silicon (SONOS) gate structure, comprising:
   providing a semiconductor substrate having a cell transistor area, a high voltage transistor area, and a low voltage transistor area;
   forming at least one memory storage pattern defining a cell gate insulating area on the semiconductor substrate within the cell transistor area, wherein the at least one memory storage pattern is formed of a first memory storage pattern and a second memory storage pattern which are spaced from each other by the cell gate insulating area;
   forming a lower gate insulating layer on the semiconductor substrate within the high voltage transistor area;
   forming a conformal upper insulating layer on the memory storage pattern, the lower gate insulating layer and the semiconductor substrate within the cell gate insulating area; and
   forming a low voltage gate insulating layer to a thickness less than a combined thickness of the upper insulating layer and the lower gate insulating layer on the semiconductor substrate within the low voltage transistor area.

15. A method of fabricating a non-volatile memory device having a local silicon-oxide-nitride-oxide-silicon (SONOS) gate structure, comprising:
   providing a semiconductor substrate having a cell transistor area, a high voltage transistor area, and a low voltage transistor area;
   forming at least one memory storage pattern defining a cell gate insulating area on the semiconductor substrate within the cell transistor area, wherein the memory storage pattern is formed of a tunnel insulating layer pattern and a charge trapping pattern which are sequentially stacked; forming a lower gate insulating layer on the semiconductor substrate within the high voltage transistor area;
   forming a conformal upper insulating layer on the memory storage pattern, the lower gate insulating layer, and the semiconductor substrate within the cell gate insulating area; and
   forming a low voltage gate insulating layer to a thickness less than a combined thickness of the upper insulating layer and the lower fate insulating layer on the semiconductor substrate within the low voltage transistor area.

16. The method as recited in claim 15, wherein the tunnel insulating layer pattern is formed of any one of a silicon oxide layer, a silicon oxynitride layer, and a high-k dielectric layer.

17. The method as recited in claim 15, wherein the charge trapping pattern is formed of any one of a silicon nitride layer, a boron nitride layer, and a high-k dielectric layer.

18. A method of fabricating a non-volatile memory device having a local silicon-oxide-nitride-oxide-silicon (SONOS) gate structure, the method comprising:
   providing a semiconductor substrate having a cell transistor area, a high voltage transistor area, and a low voltage transistor area;

forming at least one memory storage pattern defining a cell gate insulating area on the semiconductor substrate within the cell transistor area;

forming a lower gate insulating layer on the semiconductor substrate within the high voltage transistor area;

forming a conformal upper insulating layer on the memory storage pattern, the lower gate insulating layer, and the semiconductor substrate within the cell gate insulating area;

forming a low voltage gate insulating layer to a thickness less than a combined thickness of the upper insulating layer and the lower gate insulating layer on the semiconductor substrate within the low voltage transistor area; and forming an oxidation barrier layer on the semiconductor substrate within the cell gate insulating area prior to formation of the conformal upper insulating layer.

19. The method as recited in claim 18, wherein the oxidation barrier layer is formed of a silicon oxynitride layer using a thermal oxidation method.

20. A method of fabricating a non-volatile memory device having a local silicon-oxide nitride-oxide-silicon (SONOS) gate structure, the method comprising:

providing a semiconductor substrate having a cell transistor area, a high voltage transistor area, and a low voltage transistor area;

forming at least one memory storage pattern defining a cell sate insulating area on the semiconductor substrate within the cell transistor area;

forming a lower sate insulating layer on the semiconductor substrate within the high voltage transistor area;

forming a conformal upper insulating layer on the memory storage pattern, the lower gate insulating layer, and the semiconductor substrate within the cell sate insulating area;

forming a low voltage sate insulating layer to a thickness less than a combined thickness of the upper insulating layer and the lower gate insulating layer on the semiconductor substrate within the low voltage transistor area;

forming a conductive layer on an entire surface of the semiconductor substrate having the upper insulating layer and the low voltage gate insulating layer; and patterning the conductive layer to form a control gate electrode, a high voltage gate electrode, and a low voltage gate electrode, within the cell transistor area, the high voltage transistor area, and the low voltage transistor area, respectively.

21. The method as recited in claim 20, wherein the oxidation barrier layer and the upper insulating layer which are stacked below the control gate electrode operates as a cell gate insulating layer, and the lower gate insulating layer and the upper insulating layer which are stacked below the high voltage gate electrode operates as a high voltage gate insulating layer.

22. The method as recited in claim 21, wherein the high voltage gate insulating layer is formed thicker than the cell gate insulating layer.

23. A method of fabricating a non-volatile memory device having a local silicon-oxide-nitride-oxide-silicon (SONOS) gate structure, comprising:

providing a semiconductor substrate having a cell transistor area, a high voltage transistor area, and a low voltage transistor area;

forming at least one memory storage pattern defining a cell gate insulating area on the semiconductor substrate within the cell transistor area; forming a lower gate insulating layer on the semiconductor substrate within the high voltage transistor area;

forming an oxidation barrier layer on the semiconductor substrate within the cell gate insulating area;

forming a conformal upper insulating layer on the memory storage pattern, the lower gate insulating layer, and the oxidation barrier layer; and forming a low voltage gate insulating layer to a thickness less than a combined thickness of the upper insulating layer and the lower gate insulating layer on the semiconductor substrate within the low voltage transistor area.

24. The method as recited in claim 23, wherein the lower gate insulating layer is formed of any one of a silicon oxide layer and a silicon oxynitride layer.

25. The method as recited in claim 23, wherein the oxidation barrier layer is formed of a silicon oxynitride layer using a thermal oxidation method.

26. The method as recited in claim 23, further comprising:

forming a conductive layer on an entire surface of the semiconductor substrate having the upper insulating layer and the low voltage gate insulating layer; and patterning the conductive layer to form a control gate electrode, a high voltage gate electrode, and a low voltage gate electrode, within the cell transistor area, the high voltage transistor area, and the low voltage transistor area, respectively.

27. The method as recited in claim 26, wherein the oxidation barrier layer and the upper insulating layer which are stacked below the control gate electrode operate as a cell gate insulating layer, and the lower gate insulating layer and the upper insulating layer which are stacked below the high voltage gate electrode operate as a high voltage gate insulating layer.

28. The method as recited in claim 27, wherein the high voltage gate insulating layer is formed thicker than the cell gate insulating layer.

* * * * *

UNITED STATES PATENT AND TRADEMARK OFFICE
CERTIFICATE OF CORRECTION

PATENT NO. : 7,179,709 B2 Page 1 of 1
APPLICATION NO. : 11/146501
DATED : February 20, 2007
INVENTOR(S) : Kim et al.

It is certified that error appears in the above-identified patent and that said Letters Patent is hereby corrected as shown below:

Column 15, line 22, delete "silicon-oxide nitride-oxide-silicon" and insert --silicon-oxide-nitride-oxide-silicon--.

Column 15, line 28, delete "sate" and insert --gate--.

Column 15, line 30, delete "sate" and insert --gate--.

Column 15, line 34, delete "sate" and insert --gate--.

Column 15, line 36, delete "sate" and insert --gate--.

Signed and Sealed this

Nineteenth Day of June, 2007

JON W. DUDAS
*Director of the United States Patent and Trademark Office*